(12) United States Patent
Nguyen et al.

(10) Patent No.: US 6,705,816 B2
(45) Date of Patent: Mar. 16, 2004

(54) WAFER TRANSPORT MECHANISM

(75) Inventors: Tue Nguyen, Fremont, CA (US); Tai Dung Nguyen, Fremont, CA (US)

(73) Assignee: Waypoint Technologies, Fremont, CA (US)

( * ) Notice: Subject to any disclaimer, the term of this patent is extended or adjusted under 35 U.S.C. 154(b) by 56 days.

(21) Appl. No.: 10/161,972

(22) Filed: Jun. 4, 2002

(65) Prior Publication Data

US 2002/0154971 A1 Oct. 24, 2002

Related U.S. Application Data

(63) Continuation-in-part of application No. 09/591,007, filed on Jun. 9, 2000, now abandoned.

(51) Int. Cl.[7] .............................. B25J 17/02; B25J 18/00
(52) U.S. Cl. ................. 414/226.05; 414/744.5
(58) Field of Search ..................... 414/226.05, 744.1, 414/744.2, 744.3, 744.4, 744.5, 935, 941

(56) References Cited

U.S. PATENT DOCUMENTS 4,728,252 A    3/1988    Lada et al.
5,720,590 A  * 2/1998    Hofmeister ............... 414/744.2
5,899,658 A  * 5/1999    Hofmeister ............... 414/744.5
6,068,442 A  * 5/2000    Flemmer et al. ......... 414/744.5

* cited by examiner

Primary Examiner—Donald P. Walsh
Assistant Examiner—Kenneth W. Bower
(74) Attorney, Agent, or Firm—Tue Nguyen

(57) ABSTRACT

A wafer transfer apparatus provides a rotational and translational motions using only one stationary motor drive. The apparatus includes a drive assembly and a transport arm assembly. The transport arm assembly includes a transport arm rotatably attached to a linking arm. The linking arm is fixedly attached to a sleeve, which is rotatably attached to a housing. A shaft runs axially through the sleeve, and coupled with the transport arm so that rotation of the sleeve relative to the shaft causes the movement of the transport arm assembly. A locking mechanism allows the shaft to be locked to the housing or to the sleeve. A motor fixedly attached to the housing and operational attached to the sleeve. When the shaft is locked to the sleeve, the motor rotates the sleeve and the shaft simultaneously, which effects rotation of the transfer arm relative to the housing. When the shaft is locked to the housing, the motor rotates the sleeve relative to the shaft, causing translation of the transfer arm relative to the housing.

26 Claims, 8 Drawing Sheets

WAFER TRANSPORT MECHANISM

This application is a continuation-in-part of application Ser. No. 09/591,007, filed Jun. 9, 2000 now ABN.

FIELD OF THE INVENTION

The present invention relates generally to material handling equipment, and more particularly to an apparatus for transporting semiconductor wafers.

BACKGROUND OF THE INVENTION

Semiconductor wafer transport is an integral aspect of semiconductor processing equipment. The wafers are usually stored in a cassette of 25 wafers. These wafers will need to be transferred to a new cassette, or need to be transferred individually to the process chamber for processing. Multiple cassettes or process chambers can be arranged in a circle or in a straight line. By far the circular arrangement is most popular, resulting in a cluster platform, consisting of one or two cassettes and up to six process chambers.

The basic movements of a wafer transport mechanism are:

1) a linear motion to bring the wafer in and out of the cassette. Most wafer transport mechanism employs a rotational motion coupled with a linking arm to convert the rotational motion to the required linear motion.

2) a motion to position the transport mechanism in front of the cassette. If the cassettes are arranged in a straight line, this motion is linear. If the cassettes are arranged in a circle, as in a cluster system, this motion is rotational.

3) a optional linear motion to pick the wafer off the wafer support, or to put down the wafer onto the wafer support. This third motion is not necessary if the wafer cassette could move up and down, but the first two motions exist in most wafer transport mechanism.

Conventional wafer transport systems use two separate motor means to carry out the first two separate motions. An example is the prior art U.S. Pat. No. 4,728,252. This patent uses a first motor to cause the rotation of the transfer arm assembly, and a second motor to cause the translation of the transfer arm. The two motors share the same rotational axis. The motor assembly also rotates together with the transport system.

The major disadvantage of the prior art systems is the usage of two separate motor means even with the proper design of two rotational motions sharing the same rotational axis. Another disadvantage of the prior art systems is the rotation of the motor assembly, thus requires flexible moving connections from a stationary power supply to the moving motors.

Wafer transport is often carried out in vacuum environment, defined as lower than atmospheric pressure, to limit possible contamination. The presence of vacuum environment requires minimum exposure of joints, bearings, hinges, and the like, which require lubrication, to the vacuum environment. The lubricating fluid in these mechanical connections can be easily vaporizes in the vacuum environment, thus requiring frequent maintenance. The evaporation of the lubricant could lead to the contamination of the wafers. Also these exposed joints could generate particles during movement, and the particles could deposit on the wafers being transported, thus degrading the wafer products.

It would be advantageous to develop an apparatus to provide a wafer transfer assembly having only one motor means to carry out the two motions.

It would be advantageous to develop an apparatus to provide a wafer transfer assembly having the motor means stationary to facilitate wire connection, and to prevent wire connection from a stationary power supply to a moving motor means.

It would be advantageous to develop an apparatus to provide a wafer transfer assembly suitable to operate in vacuum environment.

SUMMARY OF THE INVENTION

Accordingly, a wafer transport apparatus for transfer wafers using only one motor means is provided. The transport apparatus transfers wafers between any two locations arranged within a range of radius. The transport apparatus is also suited for low pressure environment because of its minimum exposure of joints and bearing surfaces.

The wafer transport apparatus for transporting a wafer relative to a housing comprises:

a) a sleeve mounted to rotate relative to the housing;

b) a shaft mounted coaxially within the sleeve, the shaft being mounted to rotate relative to the sleeve and also to rotate relative to the housing;

c) a linking arm fixedly attached to one end of the sleeve;

d) a transport arm rotatably attached to the other end of the linking arm, wherein the transport arm could be adapted to support the workpiece;

e) means for coupling the transport arm to the shaft so that rotation of the sleeve relative to the shaft causes the transport arm to rotate relative to the linking arm;

f) means for rotating the sleeve; and g) locking means for locking the shaft to the sleeve, whereby the shaft and the sleeve rotating together relative to the housing, and for locking the shaft to the housing, whereby the sleeve rotating relative to the shaft and the housing.

The wafer transport apparatus includes a hollow cylindrical sleeve and a shaft mounted coaxially on a housing. The sleeve and the shaft can be rotated independently relative to each other and relative to the housing. One way to accomplish this rotatable assembly is to provide a bearing for the sleeve relative to the housing, and another bearing for the shaft relative to the sleeve. If the sleeve and the shaft is long, double bearing might be necessary to ensure proper alignment. A linking arm is fixedly attached to one end of the sleeve, and a transport arm is rotatably attached to the other end of the linking arm. The other end of the transport arm can be adapted to support a workpiece, such as a wafer or multiple wafers. A linkage assembly couples the shaft to the transport arm so that a rotation of the sleeve relative to the shaft causes the transport arm to rotate relative to the linking arm. A locking assembly can lock the shaft and the sleeve together, and can lock the shaft and the housing together. When the shaft and the sleeve are locked together, rotational movement of the sleeve causes the linking arm and the transport arm to rotate about the axis of the shaft (which is also the axis of the sleeve), thus changing the angular position of the transport arm. When the shaft and the housing are locked together, rotational movement of the sleeve causes the linking arm to rotate about the axis of the shaft and the transport arm to rotate about the axis of the linking arm, thus changing the radial position of the transport arm. The locking means could be active, such as a brake, or passive, such as a pin design so that when the sleeve is rotated in a certain direction, the pin design causes the shaft to rotate together. The present transport apparatus requires only one motor means to rotate the sleeve to accomplish two movements, angular and radial positions, of the wafer supporting end of the transport arm.

The invention further provides an extended assembly to extend the radial position, or the arm reach, of the wafer. The extended assembly comprises:

h) an end effector rotatably attached to the other end of the transport arm, wherein the end effector could be adapted to support the workpiece;

i) means for coupling the end effector to the transport arm so that rotation of the transport arm relative to the linking arm causes the end effector to rotate relative to the transport arm.

This aspect of the invention attaches an end effector to the wafer support end of the transport arm, together with a second linkage assembly to couple the end effector to the transport arm so that rotation of the transport arm relative to the linking arm causes the end effector to rotate relative to the transport arm. The end or ends of the end effector can be adapted to support a wafer or multiple wafers. The end effector could be attached at one end to the transport arm, then the other end of the end effector could be adapted to support a wafer, or multiple wafers stacking on top of each other. The end effector could be attached at the middle to transport arm, then two ends of the end effector can be adapted to support two wafers, or two multiple stacks of wafers. With the end effector, the transport apparatus has extend its reach by a distance from the end of the transport arm to the end of the end effector.

The invention further provides a means accommodate the third motion of the transport system. The transport apparatus further comprises:

j) means for moving the sleeve in the axial direction.

With the linkage assembly, when the sleeve moves in the axial direction, the transport arm also moves in the axial direction, thus causing the wafer to move in the axial direction, lifting the wafer from the wafer support at the cassette or the process chamber.

The invention further provides that the transport arm is adapted to support a single silicon wafer. In some aspect of the invention, the transport arm is adapted to support a stack of multiple silicon wafers. With the transport arm adapted to support a stack of parallel spaced silicon wafers, the apparatus can transport multiple wafers at the same time. Also the invention further provides that the end of the end effector is adapted to support a single silicon wafer. The end effector could be adapted to support two single silicon wafers at each end of the end effector if the end effector is attached to the transport arm at the middle of the end effector. In some aspect of the invention, the end effector is adapted to support a stack of multiple silicon wafers, two stacks of silicon wafers.

The invention further provides that the locking means for locking the shaft includes:

a) a first locking means for locking the shaft to the sleeve; and b) a second locking means for locking the shaft to the housing;

whereby the sleeve and shaft may be rotated simultaneously by actuating the first locking means and the sleeve may be rotated independently of the shaft by actuating the second locking means.

The invention further provides that the means for rotating the sleeve includes a motor means mounted on the housing and operatively coupled to the sleeve. In some aspect of the invention, the motor means includes a stepper or DC servo motor coupled to the sleeve by a belt.

The invention further provides that the means for coupling the transport arm includes a first pulley fixedly mounted to one end of the shaft, a second pulley rotatably mounted at the other end of the linking arm, and means for rotatably coupling the first pulley to the second pulley so that rotation of the linking arm about the shaft causes the second pulley to rotate. The means to couple the first pulley to the second pulley includes a wide variety of mechanism such as belt, timing belt, or cable drive. A roller could be mounted on a spring loaded assembly, pressing against the belt or cable drive to prevent slack in the belt or cable drive. In some aspect of the invention, the transport arm is mounted on the second pulley. In some aspect of the invention, the diameter of the first pulley is about twice the diameter of the second pulley and the length of the linking arm and the transport arm are approximately equal, so that rotation of the sleeve while the shaft is not rotated causes the end of the transport arm to translate along a straight line.

In a preferred embodiment for vacuum applications, the apparatus for transport a wafer through a vacuum housing comprises:

a) a sleeve having a hollow interior;

b) a first seal mounted on the housing for rotatably receiving the sleeve, whereby the sleeve extends between the interior and exterior of the housing;

c) a linking arm enclosure assembly having a hollow interior, said linking arm enclosure assembly being attached at one end to the interior end of the sleeve so that the hollow interior of the sleeve is open to the hollow interior of the linking arm enclosure assembly;

d) a transport arm;

e) a secondary seal mounted in the other end of the linking arm enclosure assembly for receiving the transport arm;

f) a shaft mounted coaxially within the hollow interior of the sleeve terminating at one end within the hollow interior of the linking arm enclosure assembly;

g) means for coupling the transport arm to the shaft so that rotation of the sleeve relative to the shaft causes the transport arm to rotate relative to the linking arm;

h) means for rotating the sleeve;

i) locking means for locking the shaft to the sleeve, whereby the shaft and the sleeve rotating together relative to the housing, and for locking the shaft to the housing, whereby the sleeve rotating relative to the shaft and the housing.

The first seal provides a rotary seal between the sleeve and the vacuum housing. The second seal provides a rotary seal between the linking arm enclosure and the transport arm. In this way, only these two seals are exposed to the vacuum. Typical rotary seal is a rotating o-ring seal. Other rotary seal are ferrofluid seal, magnetic seal.

DETAIL DESCRIPTION OF THE PREFERRED EMBODIMENT

Figure 1:
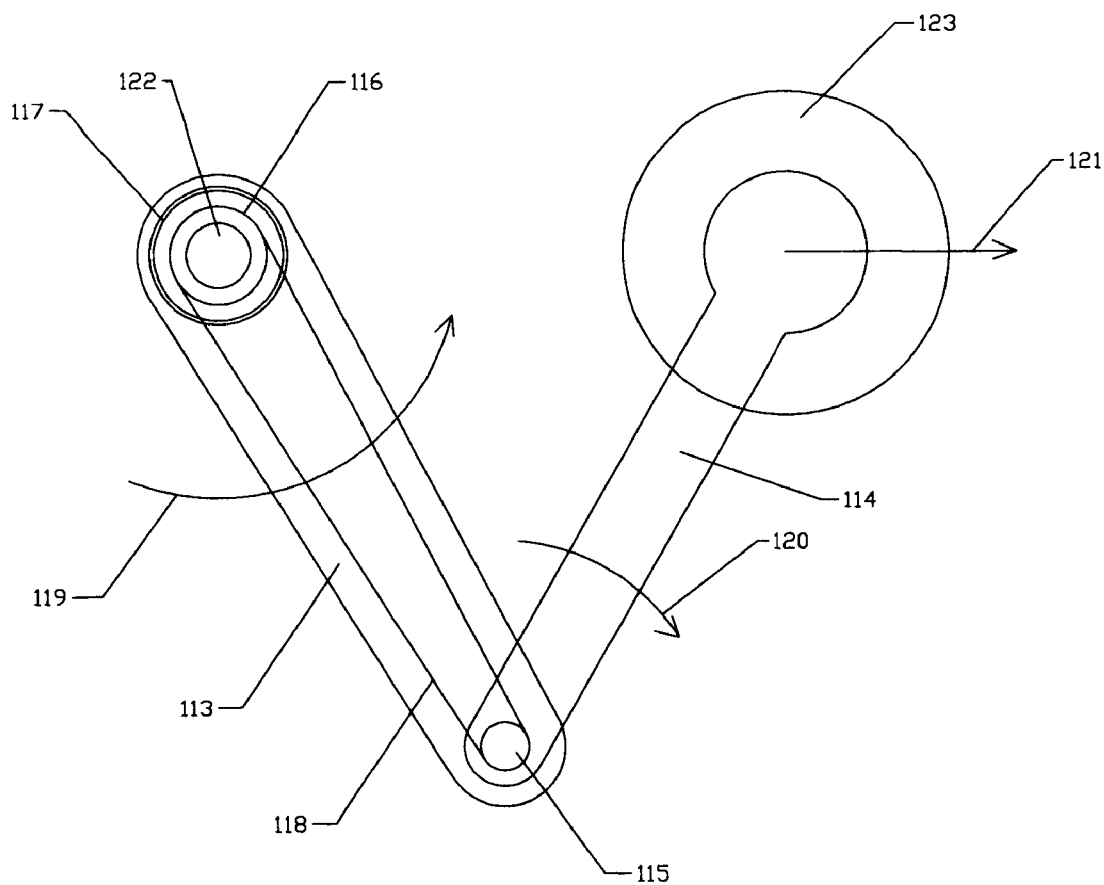
FIG. 1 shows a prior art convert scheme from rotational motion to linear motion with two piece linkage arm.

FIG. 1 shows a prior art convert scheme from rotational motion to linear motion with two piece linkage arm. The linking arm 113 rotates in the direction 119 relative to the shaft 112. This rotation causes the belt 118 to rotate in the opposite direction, resulting in the rotation of the transport arm 114 in the direction 120. The wafer 123 resting on the wafer support end of the transport arm 114 will travel in the direction 121. The maximum travel of the wafer is the sum of the lengths of the linking arm 113 and of the transport arm 114. In the case of the linking arm and the transport arm having similar length, and the diameter of the pulley 116 having twice the diameter of the pulley 115, the wafer 123 will travel a straight line.

Figure 2:
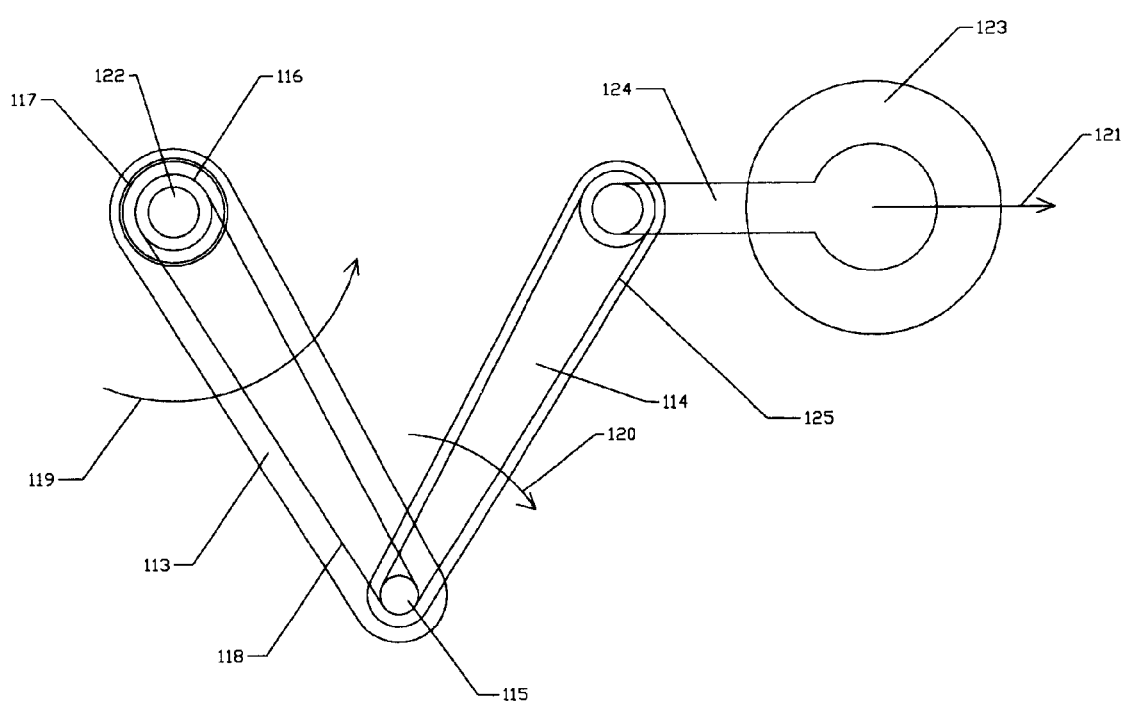
FIG. 2 shows a prior art convert scheme from rotational motion to linear motion with three piece linkage arm.

FIG. 2 shows a prior art convert scheme from rotational motion to linear motion with three piece linkage arm. The addition of the end effector 124 and the coupling 125 extends the arm reach of the transport assembly. The maximum travel of the wafer is the sum of the lengths of the linking arm 113, the transport arm 114 and the end effector 124.

Figure 3:
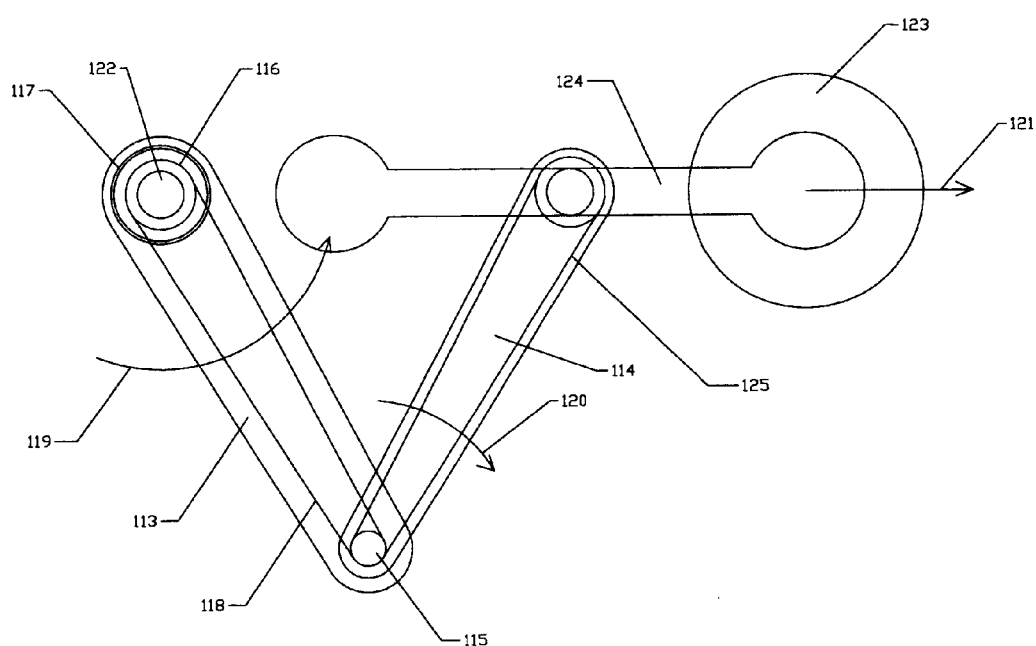
FIG. 3 shows a prior art convert scheme from rotational motion to linear motion with three piece linkage arm for moving two wafers.

FIG. 3 shows a prior art convert scheme from rotational motion to linear motion with three piece linkage arm for moving two wafers. The end effector 123 has two ends that could support a wafer.

Figure 4:
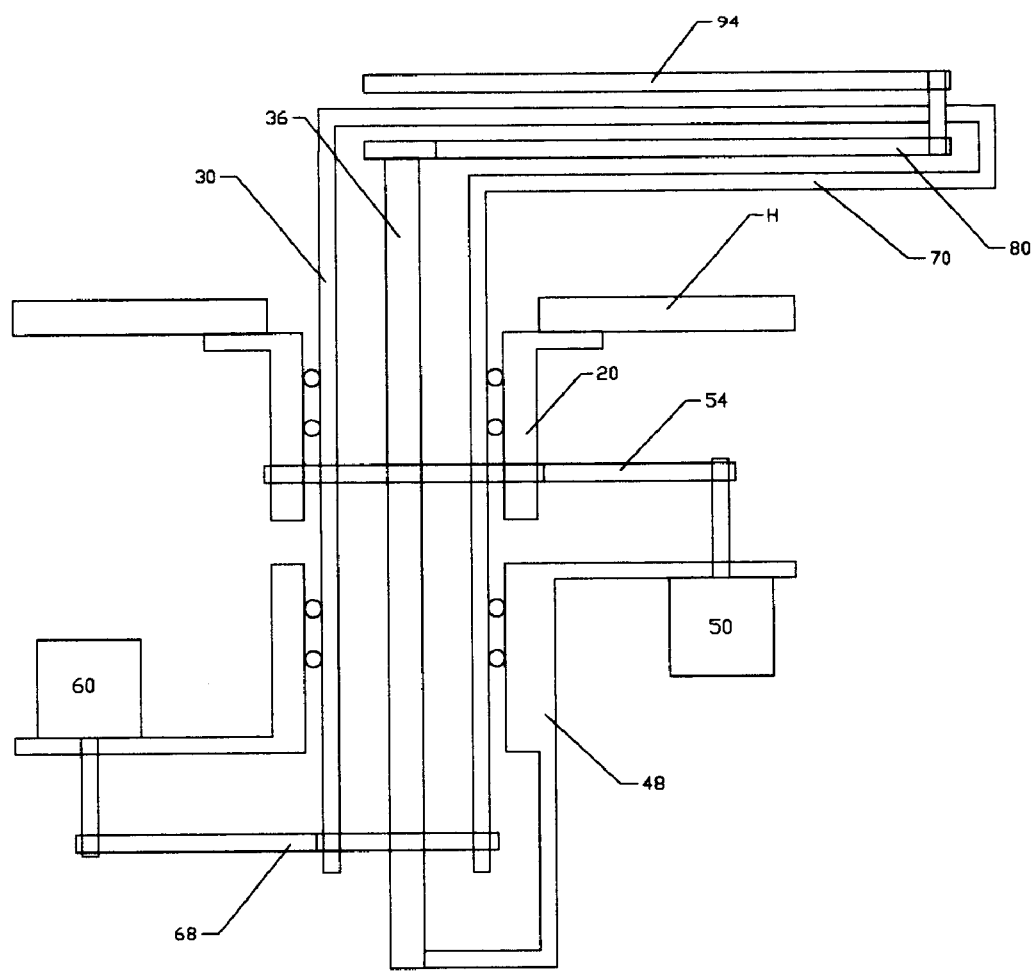
FIG. 4 shows a prior art wafer transport mechanism having two moving motor means.

FIG. 4 shows a prior art wafer transport mechanism having two moving motor means from the U.S. Pat. No. 4,728,252. The prior art wafer transport system consists of a sleeve 30, a shaft 36, a bearing assembly 48 (fixed to the shaft 36 and rotatable to the sleeve 30), a linking arm 70 attached to the sleeve 30, a transport arm 94 rotatably attached to the linking arm 70, motor means 50 and 60 mounted on the bearing assembly 48, and means 80 to coupling the transport arm 94 to the shaft 36. Motor 60 moves the belt 68, causing the sleeve 30 to rotate relative to the shaft 36 since the shaft 36 is attached to the bearing assembly 48. Motor 50 moves the belt 54. Since the belt end is fixed to the housing H through an extra bearing 20, the motion causes the rotation of the motor 50 itself, the bearing assembly 48, the motor 60, and the shaft 36. The motor 60 causes the translation of the transport arm 94, and motor 50 causes the rotation of the transport arm 94. This prior art system requires two motors 50 and 60 for two motions, and since these motors 50 and 60 are moving, the electrical connections to these motors will require moving wire connection, meaning an wire guide is required to prevent the electrical connections to these motors from tangling to the moving motors.

Figure 5:
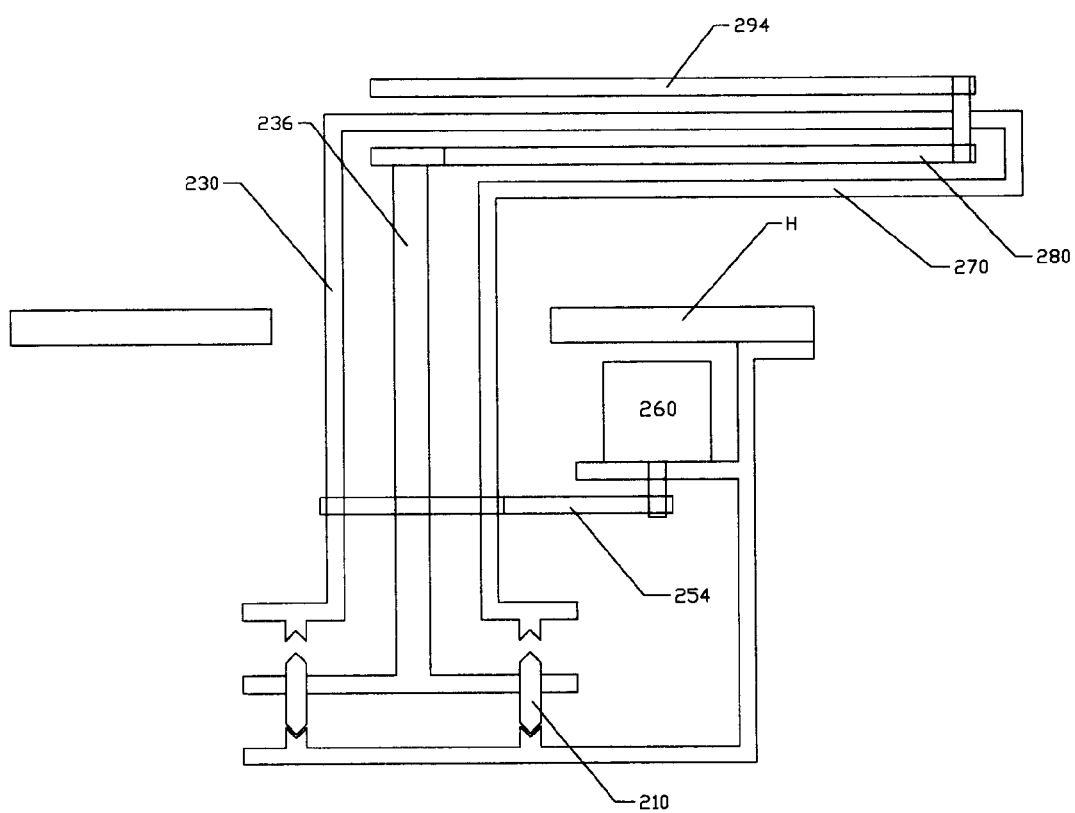
FIG. 5 shows the present invention of wafer transport mechanism having one stationary motor means.

FIG. 5 shows the present invention of wafer transport mechanism having one stationary motor means. The present invention wafer transport system consists of a sleeve 230, a shaft 236, a linking arm 270 attached to the sleeve 230, a transport arm 294 rotatably attached to the linking arm 270, a stationary motor means 260 attached to the housing H, means 280 to coupling the transport arm 294 to the shaft 236, and a locking mechanism 210 to lock the shaft 236 to the sleeve 230, and to lock the shaft 236 to the housing H. When the locking mechanism 210 locks the shaft 236 to the housing H, the motor 260 will rotate the sleeve 230 relative to the shaft 236. This motion causes the translation of the transport arm 294. When the locking mechanism 210 locks the shaft 236 to the sleeve 230, the motor 260 will rotate the sleeve 230 together with the shaft 236. This motion will cause the rotation of the transport arm 294. The locking mechanism could be separated into two independent locking components, one to lock the shaft to the sleeve and one to lock the shaft to the housing.

The present invention requires only one motor means, together with a locking mechanism, to accomplish the two motions of the transport arm. Furthermore, the motor means is stationary, thus there is no moving wire connection.

Figure 6:
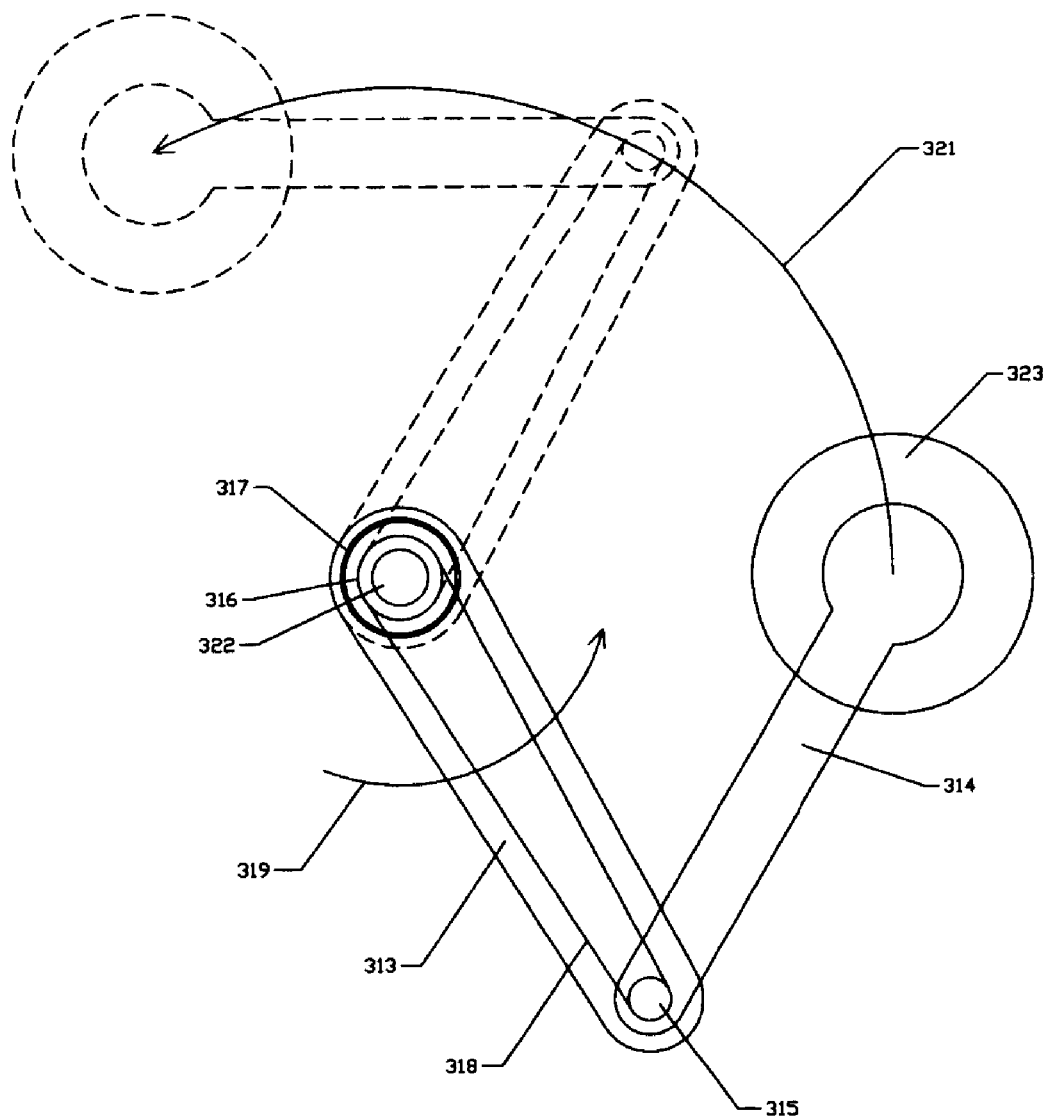
FIG. 6 shows a rotational movement of the present invention of wafer transport mechanism.

FIG. 6 shows a rotational movement of the present invention of wafer transport mechanism. With the sleeve 317 locks onto the shaft 322, the transport arm 314 will rotate in the direction of 321.

Figure 7:
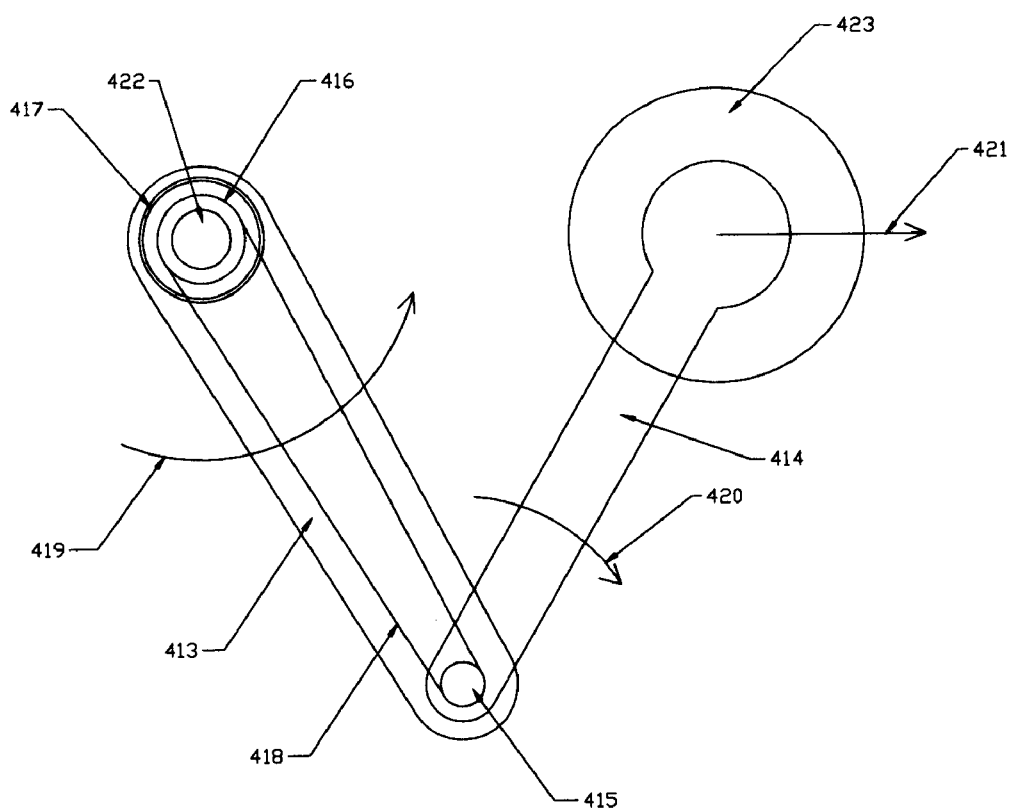
FIG. 7 shows a translational movement of the present invention of wafer transport mechanism.

FIG. 7 shows a translational movement of the present invention of wafer transport mechanism. With the shaft 422 locks onto the housing, the transport arm 414 will move in the direction of 421.

Figure 8:
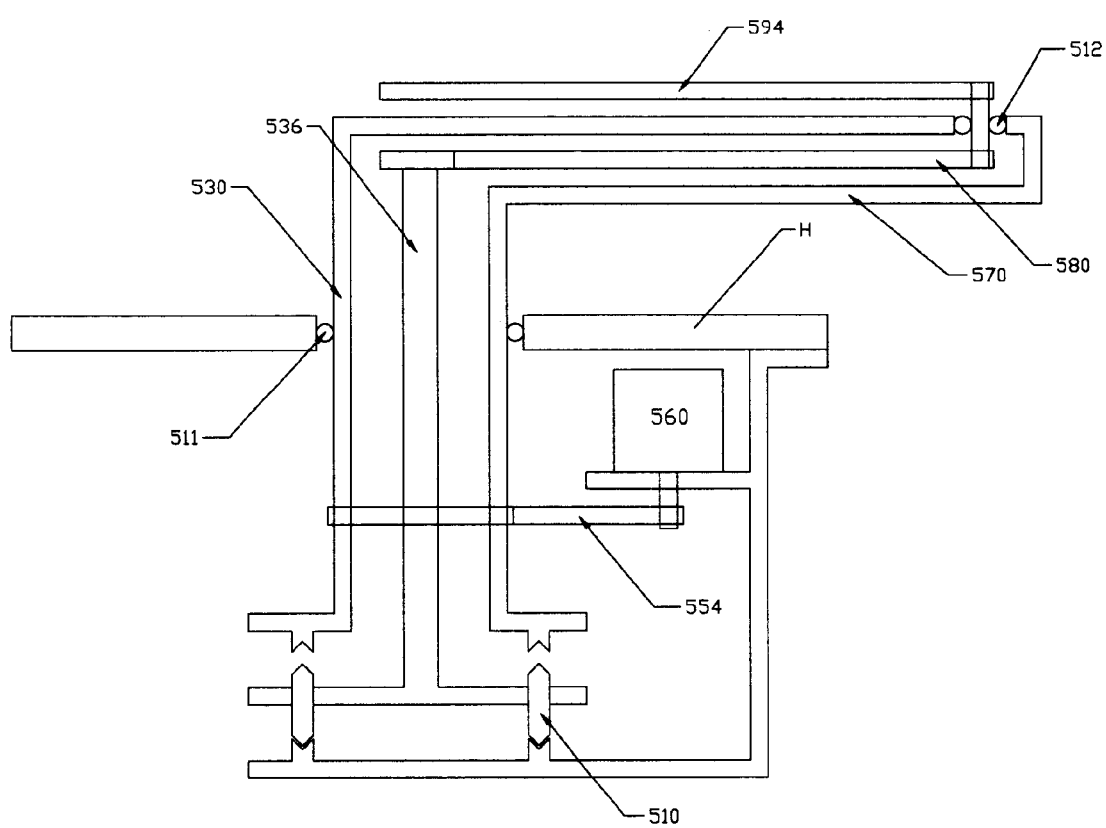
FIG. 8 shows the present invention of wafer transport mechanism adapted for vacuum application.

FIG. 8 shows the present invention of wafer transport mechanism adapted for vacuum application. The first seal 511 is a rotary seal, allowing the sleeve 530 to rotate while maintaining the pressure differential between the inside and the outside of the housing across the sleeve. The second seal is also a rotary seal, allowing the transport arm 594 to rotate while maintaining the pressure differential between the inside and the outside of the housing across the transport arm and the linking arm.

What is claimed is:

1. An apparatus for transporting a workpiece relative to a housing, said apparatus comprising:
   a) a sleeve mounted to rotate relative to the housing;
   b) a shaft mounted coaxially within the sleeve, the shaft being mounted to rotate relative to the sleeve and also to rotate relative to the housing;
   c) a linking arm fixedly attached to one end of the sleeve;
   d) a transport arm rotatably attached to the other end of the linking arm, wherein the transport arm could be adapted to support the workpiece;
   e) means for coupling the transport arm to the shaft so that rotation of the sleeve relative to the shaft causes the transport arm to rotate relative to the linking arm;
   f) means for rotating the sleeve; and
   g) locking means for locking the shaft to the sleeve, whereby the shaft and the sleeve rotating together relative to the housing, and for locking the shaft to the housing, whereby the sleeve rotating relative to the shaft and the housing.

2. An apparatus as in claim 1 further comprising
   h) an end effector rotatably attached to the other end of the transport arm, wherein the end effector could be adapted to support the workpiece;
   i) means for coupling the end effector to the transport arm so that rotation of the transport arm relative to the linking arm causes the end effector to rotate relative to the transport arm.

3. An apparatus as in claim 1 further comprising
   j) means for moving the sleeve in the axial direction.

4. An apparatus as in claim 1, wherein the transport arm is adapted to support a single silicon wafer.

5. An apparatus as in claim 1, wherein the transport arm is adapted to support a stack of multiple silicon wafer.

6. An apparatus as in claim 2, wherein the end of the end effector is adapted to support a single silicon wafer.

7. An apparatus as in claim 2, wherein the end of the end effector is adapted to support a stack of multiple silicon wafer.

8. An apparatus as in claim 1, wherein the locking means for locking the shaft includes:
   a) a first locking means for locking the shaft to the sleeve; and
   b) a second locking means for locking the shaft to the housing;
   whereby the sleeve and shaft may be rotated simultaneously by actuating the first locking means and the sleeve may be rotated independently of the shaft by actuating the second locking means.

9. An apparatus as in claim 1, wherein the means for rotating the sleeve includes a motor means mounted fixedly coupled to the housing and operatively coupled to the sleeve.

10. An apparatus as in claim 9, wherein the motor means includes a stepper or DC servo motor coupled to the sleeve by a belt.

11. An apparatus as in claim 1, wherein the means for coupling the transport arm includes a first pulley fixedly attached to one end of the shaft, a second pulley rotatably mounted at the other end of the linking arm, and means for rotatably coupling the first pulley to the second pulley so that rotation of the linking arm about the shaft causes the second pulley to rotate.

12. An apparatus as in claim 11, wherein the transport arm is mounted on the second pulley.

13. An apparatus as in claim 11, wherein the diameter of the first pulley is about twice the diameter of the second pulley and the length of the linking arm and the transport arm are approximately equal, so that rotation of the sleeve while the shaft is not rotated causes the end of the transport arm to translate along a straight line.

14. An apparatus for transporting a workpiece through a vacuum housing, the apparatus comprising:
   a) a sleeve having a hollow interior;
   b) a first seal mounted on the housing for rotatably receiving the sleeve, whereby the sleeve extends between the interior and exterior of the housing;
   c) a linking arm enclosure assembly having a hollow interior, said linking arm enclosure assembly being attached at one end to the interior end of the sleeve so that the hollow interior of the sleeve is open to the hollow interior of the linking arm enclosure assembly;
   d) a transport arm;
   e) a secondary seal mounted in the other end of the linking arm enclosure assembly for receiving the transport arm;
   f) a shaft mounted coaxially within the hollow interior of the sleeve terminating at one end within the hollow interior of the linking arm enclosure assembly;
   g) means for coupling the transport arm to the shaft so that rotation of the sleeve relative to the shaft causes the transport arm to rotate relative to the linking arm;
   h) means for rotating the sleeve;
   i) locking means for locking the shaft to the sleeve, whereby the shaft and the sleeve rotating together relative to the housing, and for locking the shaft to the housing, whereby the sleeve rotating relative to the shaft and the housing.

15. An apparatus as in claim 14 further comprising
   h) an end effector rotatably secured to the other end of the transport arm, whereby the end effector could be adapted to support the workpiece;
   i) means for coupling the end effector to the transport arm so that rotation of the transport arm relative to the linking arm causes the end effector to rotate relative to the transport arm.

16. An apparatus as in claim 14 further comprising
   j) means for moving the sleeve in the axial direction.

17. An apparatus as in claim 14, wherein the transport arm is adapted to support a single silicon wafer.

18. An apparatus as in claim 14, wherein the transport arm is adapted to support a stack of multiple silicon wafer.

19. An apparatus as in claim 15, wherein the end of the end effector is adapted to support a single silicon wafer.

20. An apparatus as in claim 15, wherein the end of the end effector is adapted to support a stack of multiple silicon wafer.

21. An apparatus as in claim 14, wherein the locking means for locking the shaft includes:
   a) a first locking means for locking the shaft to the sleeve; and
   b) a second locking means for locking the shaft to the housing;
   whereby the sleeve and shaft may be rotated simultaneously by actuating the first locking means and the sleeve may be rotated independently of the shaft by actuating the second locking means.

22. An apparatus as in claim 14, wherein the means for rotating the sleeve includes a motor means mounted fixedly coupled to the housing and operatively coupled to the sleeve.

23. An apparatus as in claim 22, wherein the motor means includes a stepper or DC servo motor coupled to the sleeve by a belt.

24. An apparatus as in claim 14, wherein the means for coupling the transport arm includes a first pulley fixedly secured to one end of the shaft, a second pulley rotatably mounted at the other end of the linking arm, and means for rotatably coupling the first pulley to the second pulley so that rotation of the linking arm about the shaft causes the second pulley to rotate.

25. An apparatus as in claim 24, wherein the transport arm is mounted on the second pulley.

26. An apparatus as in claim 25, wherein the diameter of the first pulley is about twice the diameter of the second pulley and the length of the linking arm and the transport arm are approximately equal, so that rotation of the sleeve while the shaft is not rotated causes the end of the transport arm to translate along a straight line.

* * * * *